(12) United States Patent
Yamaguchi et al.

(10) Patent No.: US 8,325,487 B2
(45) Date of Patent: Dec. 4, 2012

(54) INSERTIONAL BUFFERING STRUCTURE OF SUBSTRATE UNIT

(75) Inventors: Toshihide Yamaguchi, Kawasaki (JP); Hideo Araki, Kawasaki (JP); Naoya Yamazaki, Kawasaki (JP)

(73) Assignee: Fujitsu Limited, Kawasaki (JP)

(\*) Notice: Subject to any disclaimer, the term of this patent is extended or adjusted under 35 U.S.C. 154(b) by 0 days.

(21) Appl. No.: 13/036,267

(22) Filed: Feb. 28, 2011

(65) Prior Publication Data

US 2011/0299257 A1  Dec. 8, 2011

(30) Foreign Application Priority Data

Jun. 4, 2010 (JP) ................................. 2010-128853

(51) Int. Cl.
*H05K 7/10* (2006.01)

(52) U.S. Cl. .................... 361/752; 361/756; 361/759

(58) Field of Classification Search ............... 439/157, 439/159; 361/752–802
See application file for complete search history.

(56) References Cited

U.S. PATENT DOCUMENTS

| | | | | |
|---|---|---|---|---|
| 4,602,835 A | * | 7/1986 | Bauer et al. ................... | 439/160 |
| 4,917,618 A | * | 4/1990 | Behrens et al. ............... | 439/157 |
| 5,226,828 A | * | 7/1993 | Fietz ............................. | 439/160 |
| 5,293,303 A | * | 3/1994 | Fletcher et al. ............... | 361/798 |
| 5,793,614 A | * | 8/1998 | Tollbom ....................... | 361/732 |
| 6,033,243 A | * | 3/2000 | Kajiura ......................... | 439/159 |
| 7,510,416 B2 | * | 3/2009 | Sato et al. ..................... | 439/160 |
| 2008/0045051 A1 | | 2/2008 | Sato et al. | |

FOREIGN PATENT DOCUMENTS

| | | |
|---|---|---|
| JP | 05-291771 | 11/1993 |
| JP | 2008-47746 | 2/2008 |

OTHER PUBLICATIONS

Patent Abstracts of Japan, Publication No. 05-291771, published Nov. 5, 1993.

\* cited by examiner

*Primary Examiner* — Angel R Estrada
*Assistant Examiner* — Dimary Lopez
(74) *Attorney, Agent, or Firm* — Staas & Halsey LLP

(57) ABSTRACT

A lever member of a lever assisted insertion device engages with a front frame of a shelf before a fully inserted position of a substrate unit to form a leverage fulcrum on the front frame. A force that an operator applies to the lever member is transmitted to the substrate unit via a point of application with respect to the fulcrum, thereby inserting the substrate unit up to the fully inserted position. A buffering device abuts against the front frame of the shelf within a depth range of a front panel of the substrate unit before an operation start position at which the lever member engages with the front frame of the shelf, to absorb impact of the substrate unit at the time of insertion.

8 Claims, 13 Drawing Sheets

INSERTIONAL BUFFERING STRUCTURE OF SUBSTRATE UNIT

CROSS-REFERENCE TO RELATED APPLICATION

This application is based upon and claims the benefit of priority of the prior Japanese Patent Application No. 2010-128853, filed on Jun. 4, 2010, the entire contents of which are incorporated herein by reference.

FIELD

The embodiments disclosed herein relate to a technique for controlling impact at the time of inserting a substrate unit into a substrate-unit mounting shelf.

BACKGROUND

Recently in electronic devices, high-speed and large-capacity transmission has been promoted, and the number of connector pins per one substrate is increasing. As a measure against the increase in the number of pins in recent electronic devices, the pin connection configuration has been changed from a double-sided contact type to a single-sided contact type. With the change in the pin connection configuration, the number of pins can be ensured, however connection per pin becomes vulnerable to physical impact, and instantaneous interruption of electrical connection easily occurs at the connector pin.

Under such a situation, in electronic devices, hot swapping enabling maintenance or function addition to be performed without interrupting the service, has been desired. Here when a substrate unit is forcibly inserted at the time of replacement or addition, insertion impact may be transmitted beyond the substrate unit to a substrate unit in a peripheral slot, to cause instantaneous interruption at a connector pin in the substrate unit being in service. For example, in a shelf-type electronic device, in a case where a member for insertion and removal (known as an insertion and removal handle or a card lever) is provided on the substrate unit side, if an operator does not use this member at the time of inserting a substrate unit, and tries to forcibly insert it with momentum (hereinafter, such a forcible insertion method is referred to as "accelerated insertion"), bumping impact of the substrate unit is transmitted to a substrate unit in a peripheral slot via a backboard of the shelf, to cause instantaneous interruption at the connector pin.

A technique described below (Japanese Laid-open Patent Publication No. 05-291771) is proposed as a measure against accelerated insertion in electronic devices, aiming at impact relaxation at the time of housing and inserting a relatively large heavy electronic device. That is, a buffering member made of hard rubber is fixed on a guide plate of an apparatus casing, and in a process of pushing a disk unit case having a disk device contained therein into the casing, a movable pin fitted to the disk unit case is struck against the buffering member to dampen the impulse at the time of insertion.

SUMMARY

The present invention provides an insertional buffering structure of a substrate unit, taking the above-mentioned issues into consideration. In a shelf-type electronic device including; a substrate unit, and a shelf for housing the substrate unit freely insertably and removably and having a second connector connected to which a first connector included in the substrate unit is connected on a backboard, bumping impact of the substrate unit to the backboard is alleviated at the time of insertion of the substrate unit.

In one aspect of the present invention, the substrate unit includes a lever assisted insertion device and a buffering device. The lever assisted insertion device includes a lever member that engages with a front frame of the shelf before a position at which the connector of the substrate unit (first connector) is connected to the connector of the backboard (second connector), to form a leverage fulcrum on the front frame. A force that the operator applies to the lever member is transmitted to the substrate unit via a point of application with respect to the fulcrum, thereby inserting the substrate unit up to a fully inserted position. The buffering device abuts against the front frame of the shelf within a depth range of the front panel of the substrate unit before an operation start position at which the lever member of the lever assisted insertion device engages with the front frame of the shelf, to absorb impact of the substrate unit at the time of insertion.

In another aspect, the lever assisted insertion device of the substrate unit includes a lever member that engages with the front frame of the shelf before the fully inserted position of the substrate unit at which the first connector is connected to the second connector, to form a leverage fulcrum on the front frame. A force that the operator applies to the lever member is transmitted to the substrate unit via a point of application with respect to the fulcrum, thereby inserting the substrate unit up to a fully inserted position. On the other hand, a control device changes over a first operating state in which the lever member of the lever assisted insertion device abuts against the front frame of the shelf before the operation start position at which the lever member of the lever assisted insertion device engages with the front frame of the shelf, to obstruct progress of the substrate unit ahead from the operation start position, and a second operating state in which progress ahead from the operation start position is allowed, by a predetermined control release operation performed by the operator.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Hereunder is a description of embodiments of the present invention, with reference to the drawings.

Figure 1:
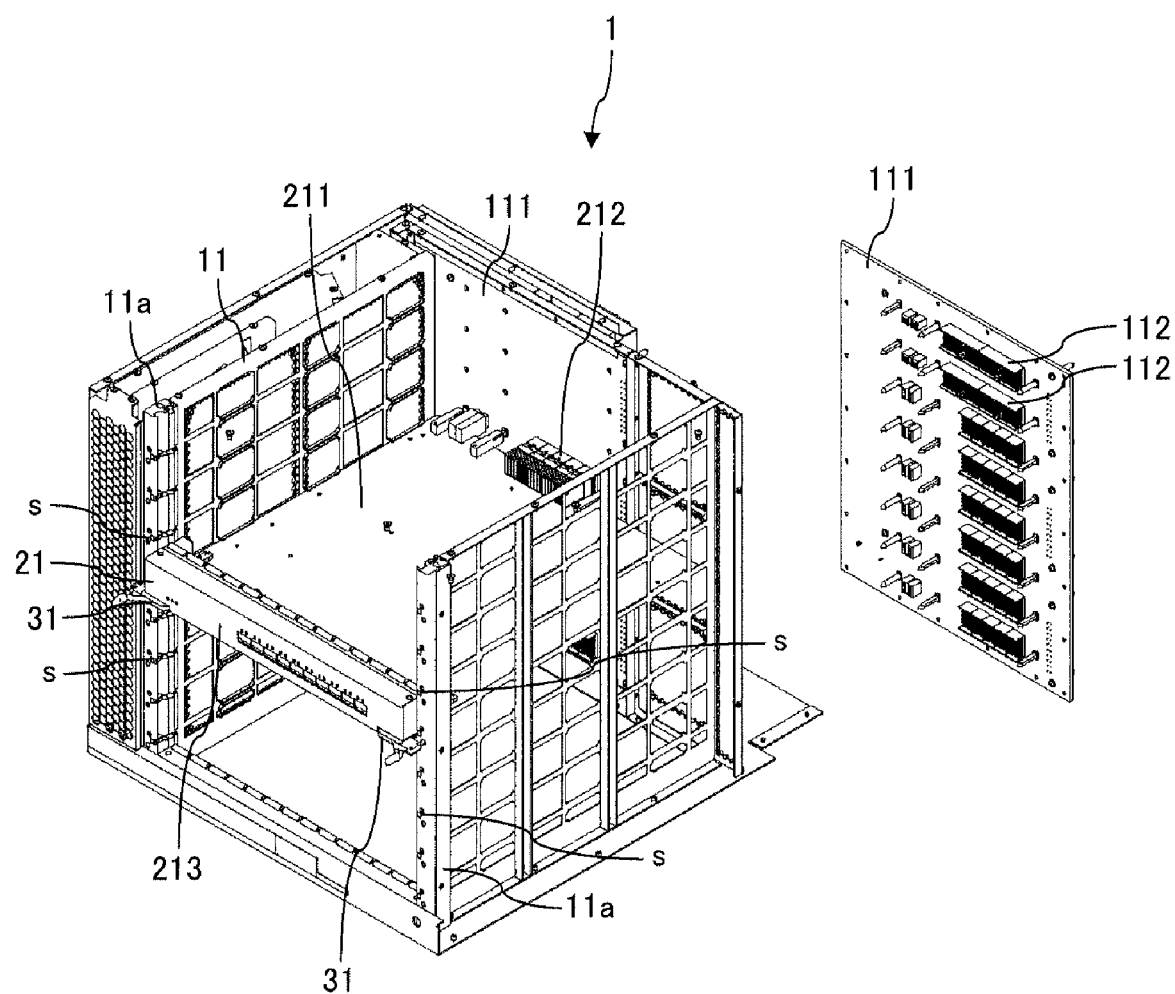
FIG. 1 is a configuration diagram of an electronic device to which an insertional buffering structure according to a first embodiment is applied.

FIG. 1 illustrates a configuration of an electronic device 1 to which an insertional buffering structure according to a first embodiment is applied, wherein an overall configuration of the electronic device 1 is depicted on the left side in FIG. 1 and only a back plane board 111 is depicted on the right side.

The electronic device 1 according to the first embodiment is a shelf-type electronic device, and for example, can be used as a server.

A shelf 11 of the electronic device 1 is such that a plurality of line cards 21 (for convenience, only one line card 21 is depicted in FIG. 1) serving as "substrate units" can be installed on top of one another so that the line cards can be freely inserted and removed. Inside of a lateral side of the shelf 11, a plurality of slots "s" for guiding the line cards 21 to respective fully inserted positions is formed. The back plane board 111 is fitted to the back side of the shelf 11, and the back plane board 111 is provided with bus connectors 112 respectively corresponding to the line cards 21. The bus connector 112 on the shelf 11 side corresponds to the "second connector". As described later, the connection configuration between the bus connector 112 according to the first embodiment and a bus connector 212 on the line card 21 side described later, is a single-sided contact type.

Figure 2A:
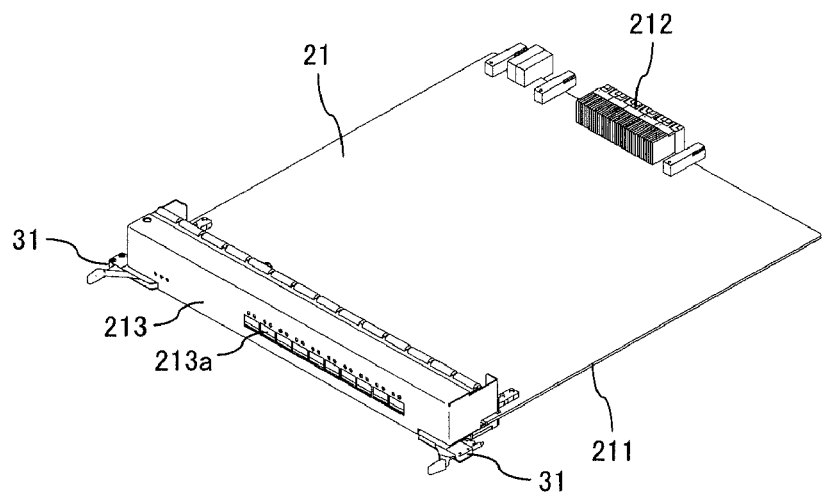
FIG. 2 is a configuration diagram of a line card according to the first embodiment.

FIG. 2 illustrates the configuration of the line card 21 according to the first embodiment in an overall diagram (a) and an exploded view (b).

The line card 21 includes a printed board (printed circuit board) 211 with electronic circuit parts mounted thereon, and the bus connector 212 is fitted to the rear part of the printed board (the front in the insertion direction of the line card 21 described later), and a front panel 213 is fitted to the front (the rear side in the insertion direction) thereof. The bus connector 212 on the line card 21 side corresponds to the "first connector", and is connected to the bus connector 112 (second connector) provided on the back plane board 111 of the shelf 11 at the fully inserted position of the line card 21. An LED display section 213a that displays the operating state of the line card 21 is provided on the front panel 213.

Figure 2B:
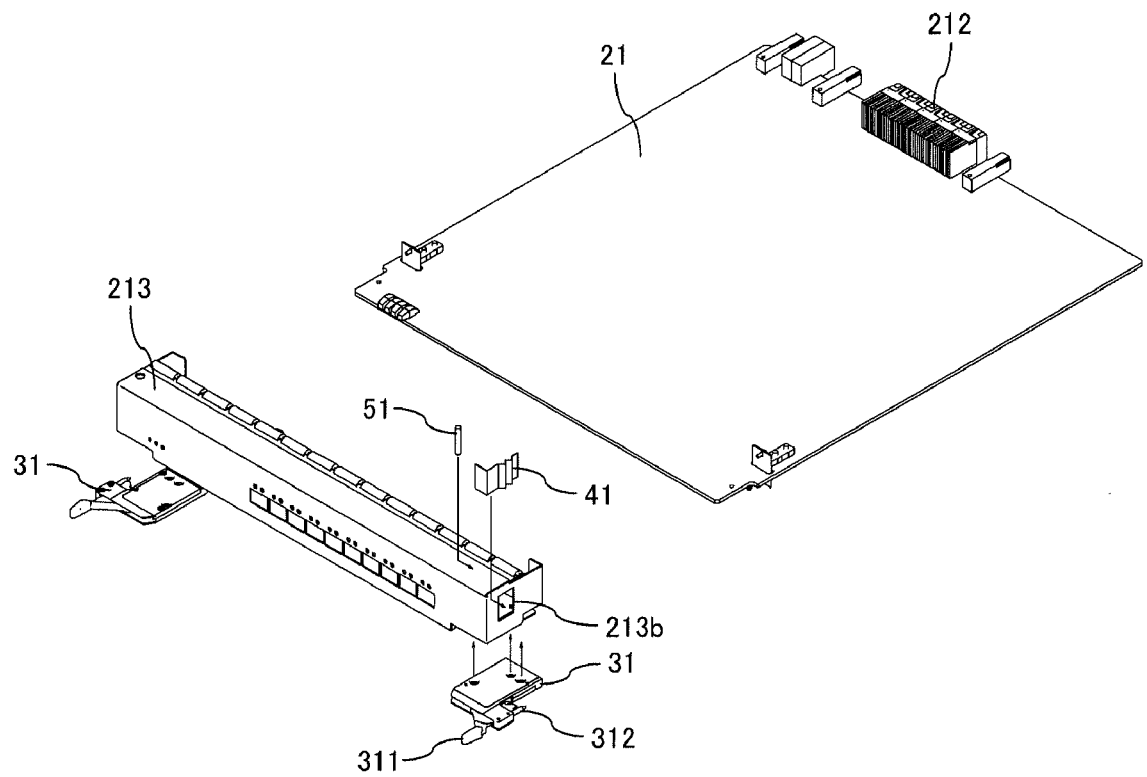
Figure 3:
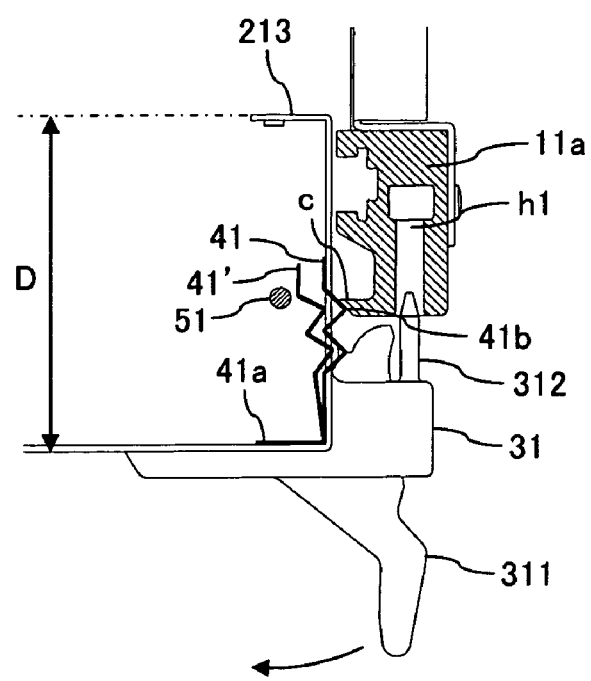
FIG. 3 is an explanatory diagram illustrating an insertional buffering operation of the line card according to the first embodiment.
Figure 9:
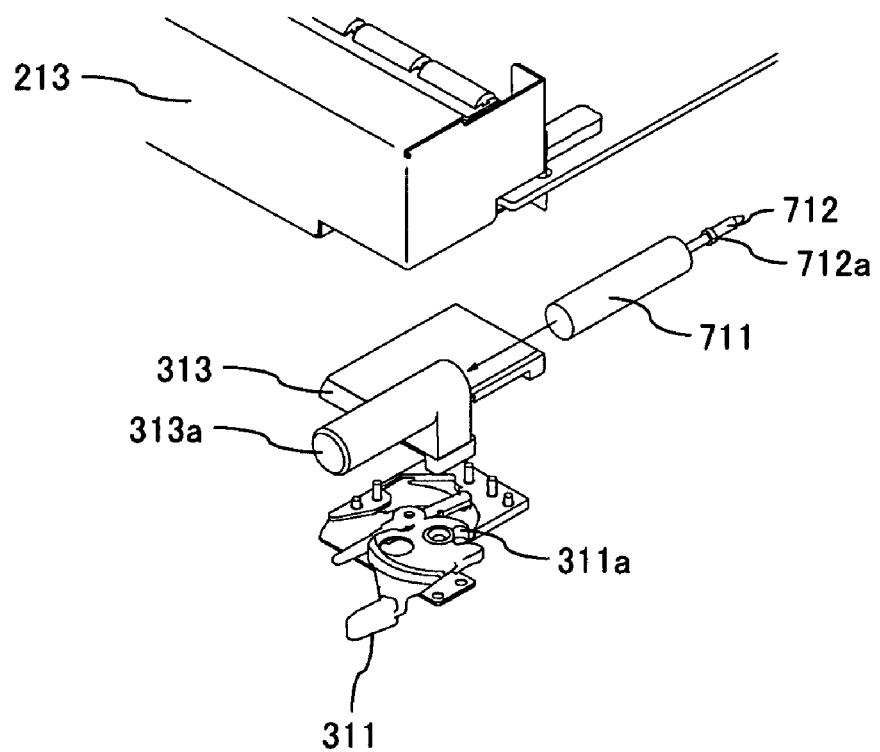
FIG. 9 is an exploded view of a card lever and a damper unit according to the second embodiment.

In the first embodiment, the insertional buffering structure of the line card 21 is constituted using a leaf spring. Specifically, as illustrated in FIG. 2(b), a card lever 31 for insertion and removal operations of the line card 21, is respectively fitted to ends on the left and right sides on a lower surface of the front panel 213, and a leaf spring member 41 and a latch pin 51 are fitted to an inner lateral side of the front panel 213. Here the leaf spring member 41 is made of a conductive metal, and as illustrated in FIG. 3, is bent to form a waveform, and is bonded to the inside of a front surface of the front panel 213 at a base end section 41a, and cantileverly supported displaceably inward with respect to the lateral side of the front panel 213 (the position at the time of displacement is illustrated by reference symbol 41' in FIG. 2). A bent corner 41b of the leaf spring member 41 is positioned outward of the lateral side of the front panel 213 via an opening 213b (FIG. 2(b)) formed to penetrate the lateral side of the front panel 213, in a state of being mounted on the front panel 213. On the other hand, in the fully inserted state of the line card 21, the leaf spring member 41 is grounded via the bent corner 41b coming in contact with the frame (specifically, the front frame 11a) of the shelf. The latch pin 51 is positioned on a side opposite to the lateral side of the front panel 213 with the leaf spring member 41 sandwiched therebetween, to restrict displacement of the leaf spring member 41 towards the inside of the front panel 213, thereby preventing plastic deformation thereof. The card lever 31 can have the same configuration as that currently being used for general line cards (for example, Japanese Laid-open Patent Publication No. 2008-047746, paragraphs 0010 to 0015), and includes a lever arm 311 rotatably fitted to the front panel 213, so that a hooked portion of the lever arm 311 engages with the front frame 11a of the shelf 11 to form a leverage fulcrum on the front frame 11a. FIG. 9 illustrates the lever arm 311 applicable to the card lever 31 of the first embodiment. A hooked portion 311a of the lever arm 311 engages with a depression c (FIG. 3) formed in the inner lateral side of the front frame 11a at the time of insertion of the line card 21. By rotating the lever arm 311 inward (in the direction of the arrow depicted in FIG. 3) about the fulcrum formed by the hooked portion 311a on the depression c, the rotary motion of the lever arm 311 is converted to a forward motion of the line card 21, and hence the line card 21 proceeds toward the fully inserted position. An alignment pin 312 is integrally formed with a casing of the card lever 31, and performs positioning of the line card 21 at the time of insertion to guide insertion of the line card 21, by being inserted into an alignment hole h1 formed in the front surface of the front frame 11a. In the first embodiment, the leaf spring member 41 constitutes an example of the "buffering device" and the card lever 31 constitutes an example of the "lever assisted insertion device". The leaf spring member 41 and the latch pin 51 can be provided on both the right side and the left side of the front panel 213, or can be provided only on one side thereof. The "buffering device" can be constituted using a conductive elastic body other than the leaf spring.

The insertional buffering operation of the card lever 31 and the leaf spring member 41 according to the first embodiment is as described below.

Figure 4A:
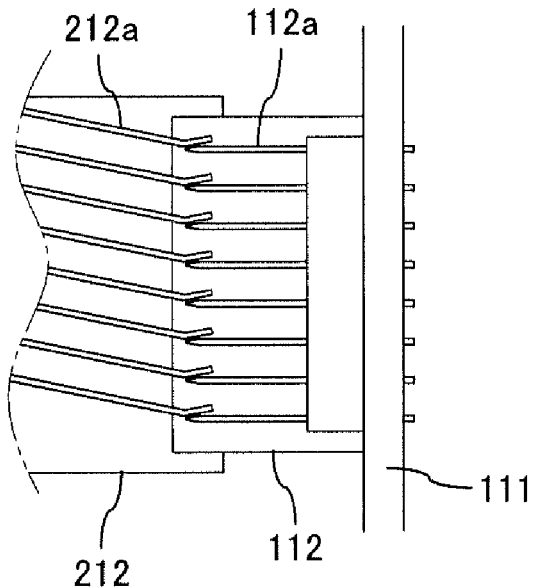
FIG. 4 is an explanatory diagram illustrating a connection state of connector pins ((a) single-sided contact type and (b) double-sided contact type).
Figure 4B:
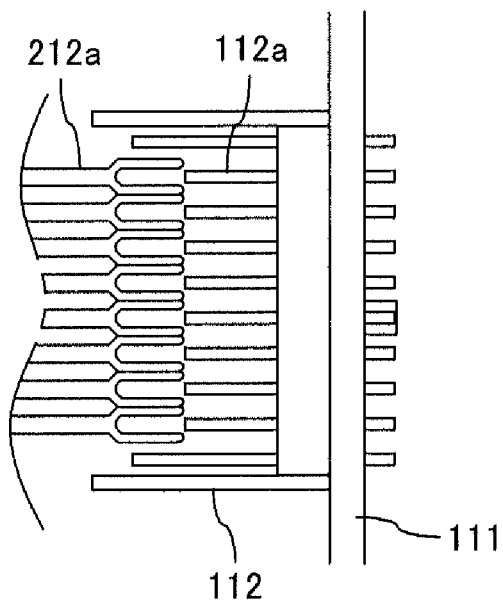
Figure 5:
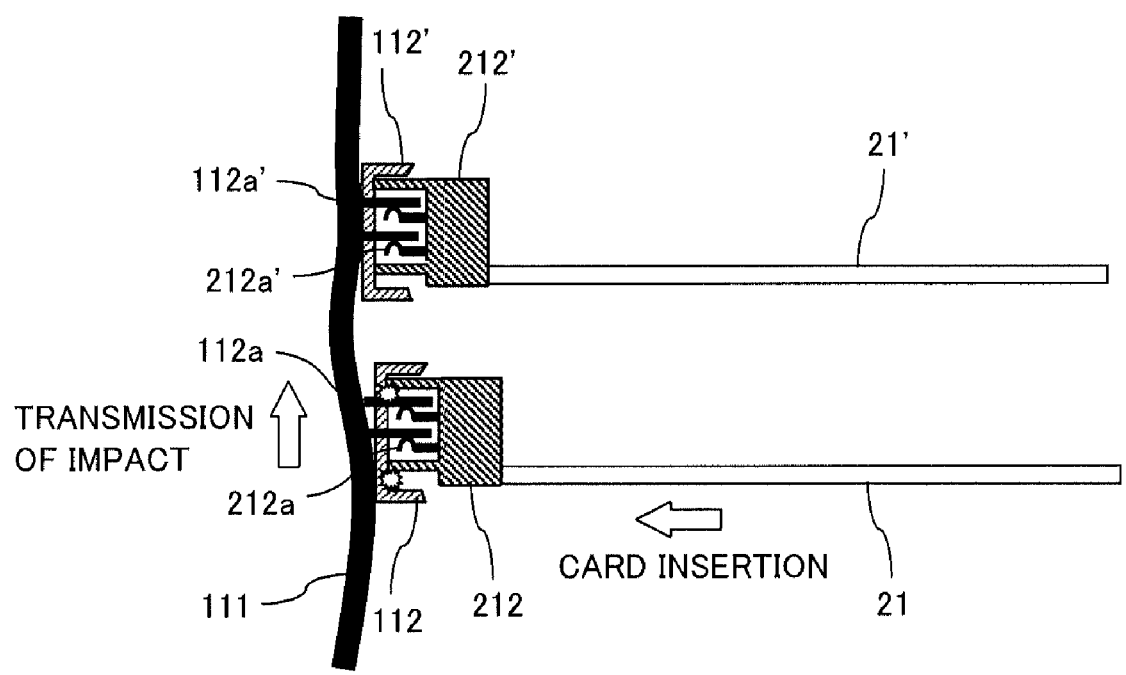
FIG. 5 is an explanatory diagram illustrating a state of occurrence of instantaneous interruption at connector pins due to impact with a back plane board.

As described above, in the insertion and removal operations of the line card 21 accompanying to maintenance or function addition of the electronic device 1, accelerated insertion with momentum performed by an operator without using the card lever 31 becomes a problem. This is because in the electronic device 1 in which a single-sided contact-type pin connection configuration is used, connection between connector pins becomes comparatively vulnerable, and instantaneous interruption easily occurs at the connector pin due to physical impact. FIG. 4 (a) illustrates an example of the single-sided contact-type pin connection configuration and FIG. 4 (b) illustrates an example of the double-sided contact-type pin connection configuration (for convenience, corresponding elements are denoted by the same reference symbols). In the double-sided contact-type pin connection configuration, a connector pin 212a on the line card 21 side (male) with the end thereof being branched into two, is connected to the connector pin 112a on the back plane board 111 side (female), so as to sandwich the connector pin 112a from the top and bottom sides. On the other hand, in the single-sided contact-type pin connection configuration, the connector pin 212a on the line card 21 side is connected to the connector pin 112a on the back plane board 111 side so as to be resiliently pressed against the connector pin 112a from an oblique direction. Accordingly, because space requirements per pin are reduced using the single-sided contact-type pin connection configuration, the number of pins for high-speed and large-capacity transmission can be ensured. However, impact resistance of the electrical connection by contact between the connector pins 112a and 212a decreases. FIG. 5 represents a situation in which vibration occurs in the back plane board 111 due to bumping impact of the line card 21, and instantaneous interruption occurs between the connector pins 112a' and 212a' (bus connectors 112' and 212') of a line card 21' in an adjacent slot due to the impact.

In the first embodiment, when the operator tries to perform accelerated insertion of the line card 21, as depicted in FIG. 3, the leaf spring member 41 (specifically, the bent corner 41b) abuts against the inner corner of the front frame 11a before the operation start position of the card lever 31 at which the hooked portion 311a of the lever arm 311 engages with the front frame 11a, to absorb the impact of the line card 21 by the elasticity thereof. Here preferably the impact acceleration of the line card 21 is suppressed to equal to or lower than 5 G due to the contact with the leaf spring member 41. According to experiments performed by the inventor and others, it is confirmed that if the impact acceleration is equal to or lower than 5 G, there is no transmission of impact to the back plane board 111 of the shelf 11 sufficient to cause instantaneous interruption at the connector pin. However, the setting based on experiment results is not intended for limiting the buffering function of the leaf spring member 41 (or the elastic body), and it does not prevent use of other settings according to connection strength of the connector pin. The impact of the line card 21 is absorbed and the momentum thereof is dampened, thereby suppressing bumping impact to the back plane board 111, and preventing instantaneous interruption at the connector pin. Here in the first embodiment, the leaf spring member 41 is supported on the inner lateral side of the front panel 213, and the bent corner 41b abuts against the front frame 11a within the depth range D (FIG. 3) of the front panel 213. Accordingly, both the line card 21 and the shelf 11 receive impact at comparatively remote positions from the bus connector 212 and the back plane board 111 at the time of contact, thereby suppressing transmission of impact to the back plane board 111 via the frame of the shelf 11 and transmission of impact to the connector pin itself via the printed board 211. Then when the line card 21 reaches the operation start position of the card lever 31, the hooked portion 311a of the lever arm 311 engages with the front frame 11a, and the operator turns the lever arm 311 inward, using the hooked portion 311a as a fulcrum of the lever, so that the line card 21 further proceeds and is inserted up to the fully inserted position.

As described above, according to the first embodiment, at the time of insertion of the line card 21, which is an example of the "substrate unit", the leaf spring member 41 (which corresponds to the "buffering device") abuts against the front frame 11a of the shelf 11 before the operation start position of the card lever 31 (which corresponds to the "lever assisted insertion device"), and the momentum of the line card 21 is dampened by the leaf spring member 41. Therefore, the operator is urged to insert the line card 21 using the card lever 31, and when accelerated insertion is performed, bumping impact to the back plane board 111 of the shelf 11 is suppressed, and instantaneous interruption at the connector pin can be prevented. Consequently, safe hot swapping of the electronic device 1 can be promoted, and normal operation of the electronic device 1 can be maintained. Moreover, according to the first embodiment, because the leaf spring member 41 abuts against the front frame 11a within the depth range D of the front panel 213 of the line card 21, both the line card 21 and the shelf 11 receive impact at comparatively remote positions from the bus connector and the back plane board 111 at the time of contact between the leaf spring member 41 and the front frame 11a. Therefore at the time of the buffering operation, transmission of impact to the back plane board 111 is suppressed, and transmission of impact to the bus connector itself can also be suppressed.

Figure 6:
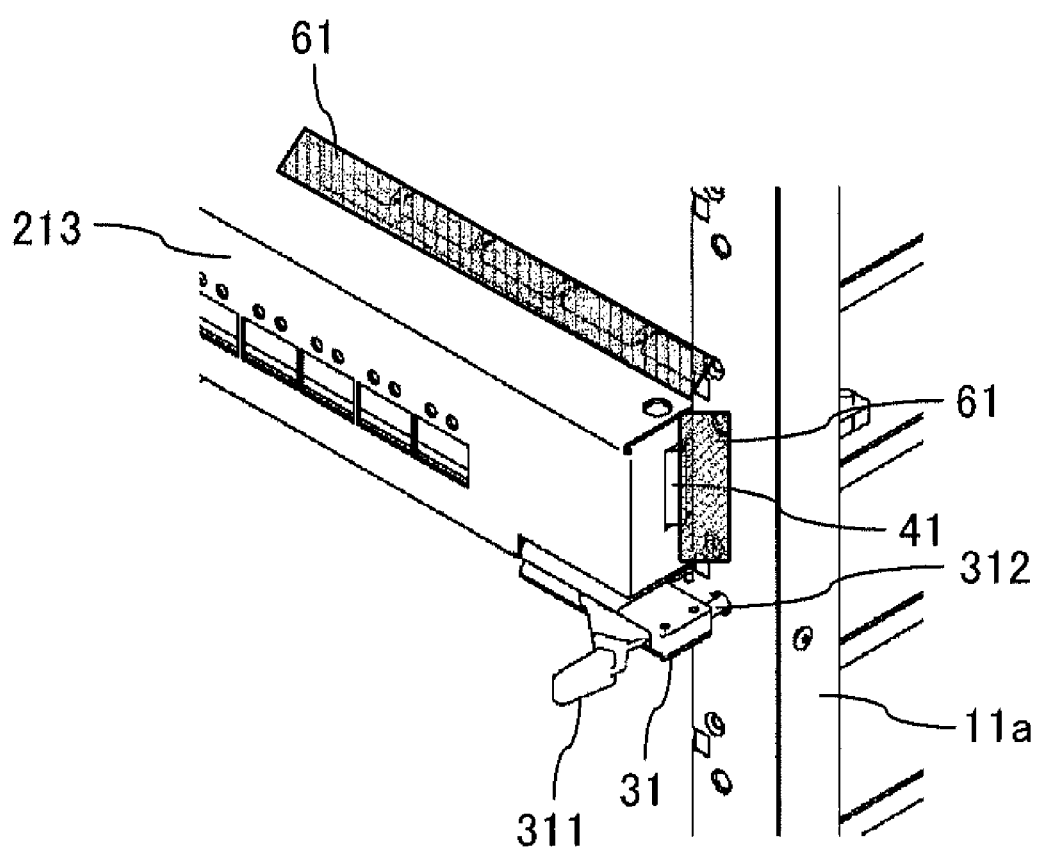
FIG. 6 is an explanatory diagram illustrating a configuration of an anti-electromagnetic wave shield in the electronic device according to the first embodiment.

Specifically, according to the first embodiment, the conductive leaf spring member 41 is employed for insertional buffering of the line card 21, and the leaf spring member 41 is arranged on the lateral side of the front panel 213, thereby connecting the bent corner 41b of the leaf spring member 41 to the frame of the shelf 11 in a state with the line card 21 being at the fully inserted position, and enabling to form a part of an anti-electromagnetic wave shield line by the leaf spring member 41 itself. Accordingly, the anti-electromagnetic wave shield of the line card 21 can be realized by less number of parts. FIG. 6 illustrates the configuration of the anti-electromagnetic wave shield according to the first embodiment. According to the first embodiment, the leaf spring member 41 is arranged on the lateral side of the front panel 213 of the line card 21, and a gasket 61 for forming a shield is placed between the front panel 213 of the line card 21 and the front frame 11a, and between the front panels 213 vertically adjacent to each other. The insertional buffering of the line card 21 can also be performed using conductive elastic bodies other than the leaf spring. By positioning at least a part of the elastic body outside of the lateral side of the front panel 213, and connecting the front panel 213 and the frame of the shelf 11 to each other via the elastic body, in the state with the line card 21 being fully inserted, the insertional buffering function and the anti-electromagnetic wave shielding function of the line card 21 can be realized by one elastic body.

Other embodiments of the present invention are described below focusing on the features of each embodiment.

Figure 7:
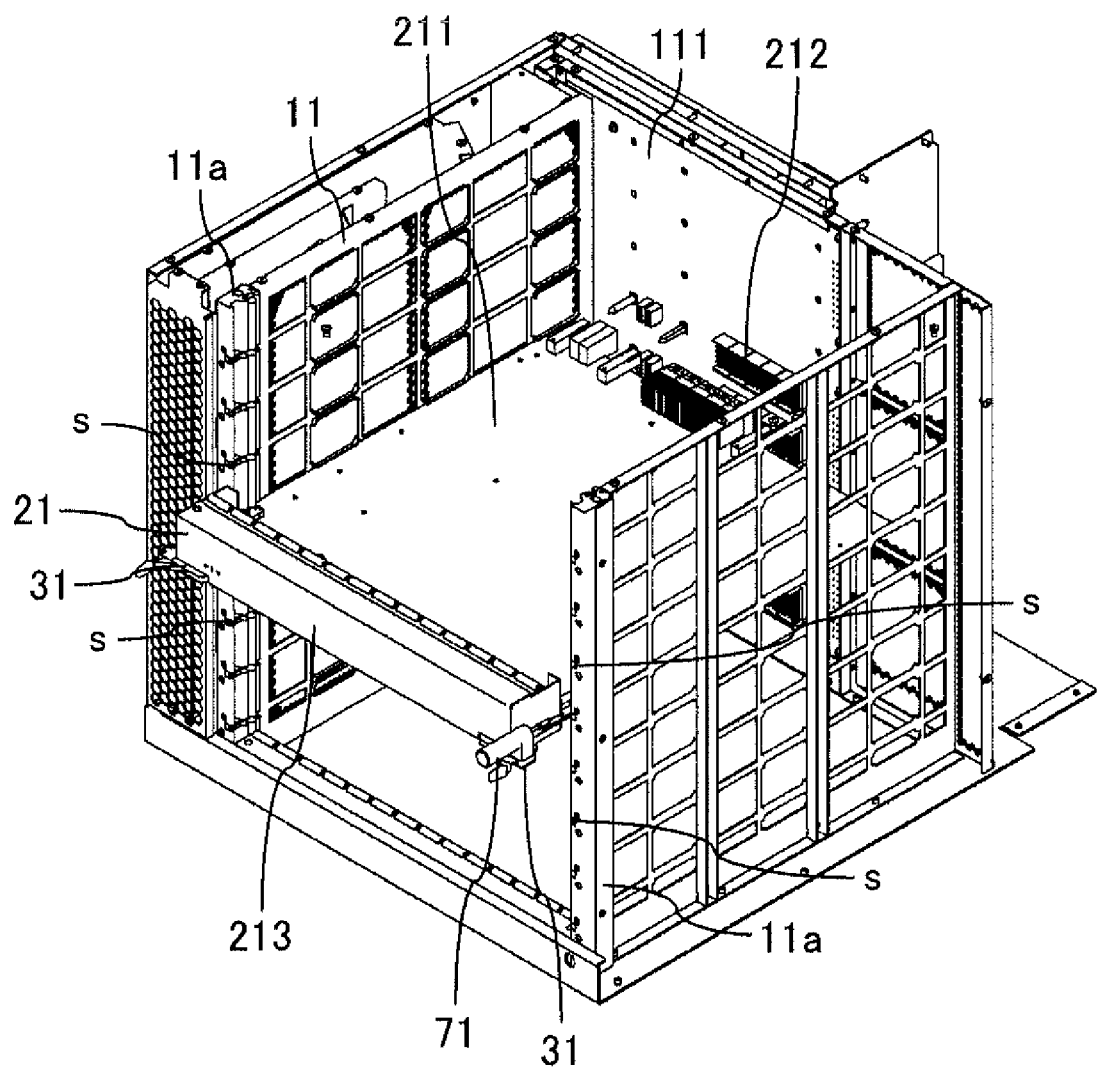
FIG. 7 is a configuration diagram of an electronic device to which an insertional buffering structure according to a second embodiment is applied.

FIG. 7 illustrates a configuration of an electronic device 1 to which an insertional buffering structure according to a second embodiment is applied. Elements and parts corresponding to those in the structure of the first embodiment are denoted by the same reference symbols as in FIG. 1.

In the second embodiment, a linear operation type damper unit 71 is employed as an example of the "buffering device". A card lever 31 is arranged on the left and right sides on a lower surface of a front panel 213, whereas, the damper unit 71 is arranged only on the right side in an insertion direction of a line card 21. The damper unit 71 has a function of suppressing impact of the line card 21, as well as a function as an alignment device of the line card 21 by means of a movable portion (712) thereof, as described later. Therefore the damper unit 71 can be provided on both the left and right sides as required.

Figure 8:
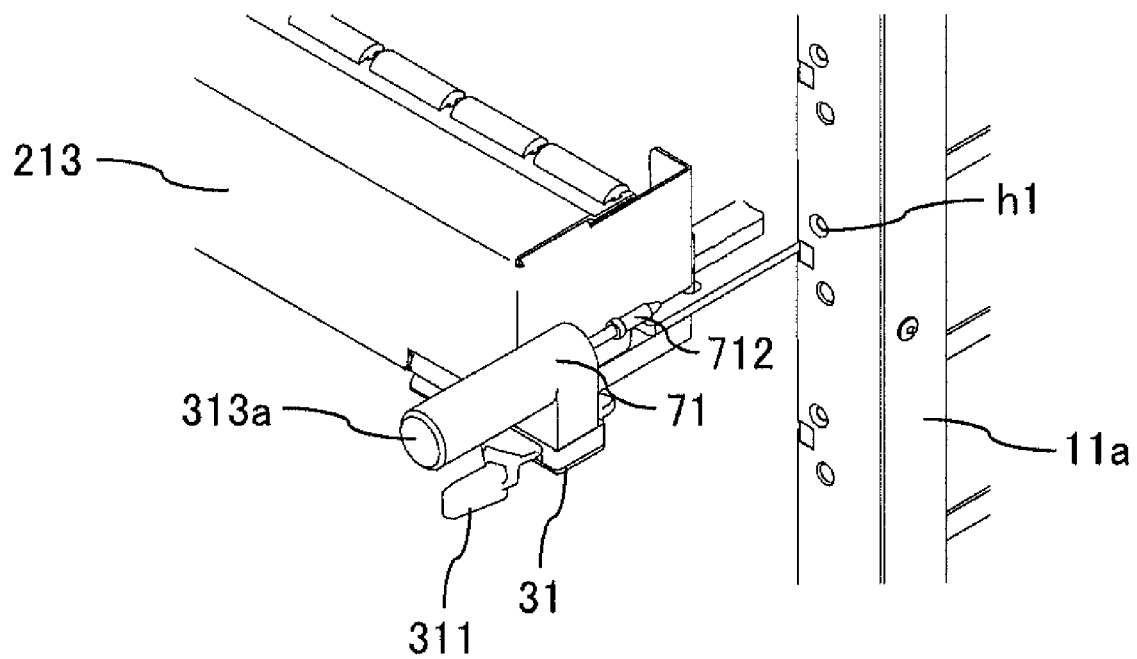
FIG. 8 is a partially enlarged view of the electronic device illustrating the insertional buffering structure according to the second embodiment.
Figure 10:
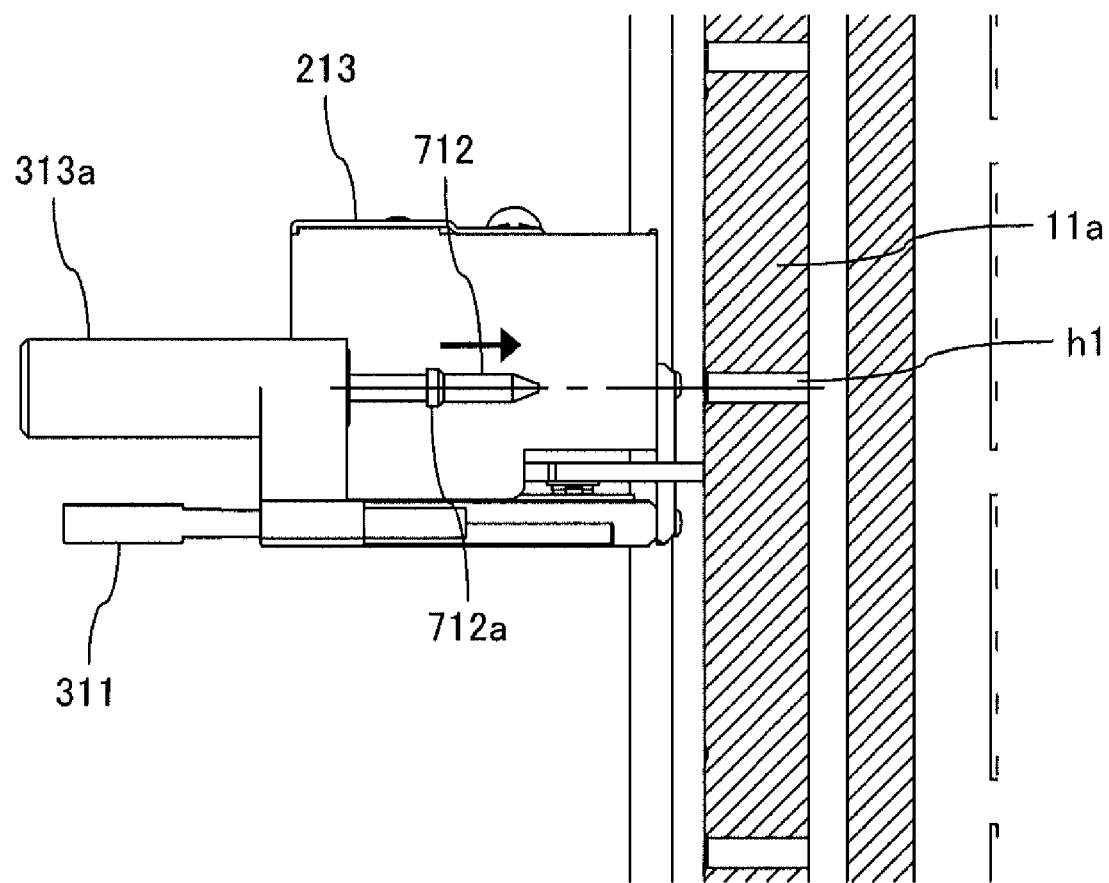
FIG. 10 is an explanatory diagram illustrating an alignment operation of the insertional buffering structure according to the second embodiment, in a partial sectional view of the electronic device as seen from the side thereof.

FIG. 8 illustrates a state in which the damper unit 71 is fitted to the front panel 213 of the line card 21, and FIG. 9 illustrates a state in which the damper unit 71 (and the card lever 31) are disassembled. In the second embodiment, as depicted in FIG. 8, the damper unit 71 and the card lever 31 are integrally formed. A cylinder holder 313a that can house a cylinder 711 of the damper unit 71, is formed on a casing 313 of the card lever 31 that houses a lever arm 311, and the cylinder 711 is housed in the cylinder holder 313a, thereby constituting the damper unit 71 integrated with the card lever 31 (FIG. 9). Here as depicted in FIG. 10, the damper unit 71 includes a pin rod 712 extending in the insertion direction of the line card 21 at an end of the movable portion, and the pin rod 712 is fitted in an alignment hole h1 in the front surface of the front frame 11a at the time of insertion of the line card 21, to perform positioning of the line card 21. A countersunk shaped portion or an enlarged diameter portion 712a at the rear end of the pin rod 712 abuts against a portion of the front frame 11a around the alignment hole h1. As a result, the cylinder 711 exerts a function as an attenuator, and absorbs impact of the line card 21.

According to the second embodiment, at the time of insertion of the line card 21, the damper unit 71 dampens the momentum of the line card 21 to prevent instantaneous interruption at the connector pin, and maintain the normal operation of the electronic device 1. Moreover, because the damper unit 71 and the card lever 31 are integrally formed and the movable rod 712 of the damper unit 71 also functions as the alignment device of the line card 21, the number of parts can be decreased, and the space around the front panel 213 can be efficiently used.

Figure 11:
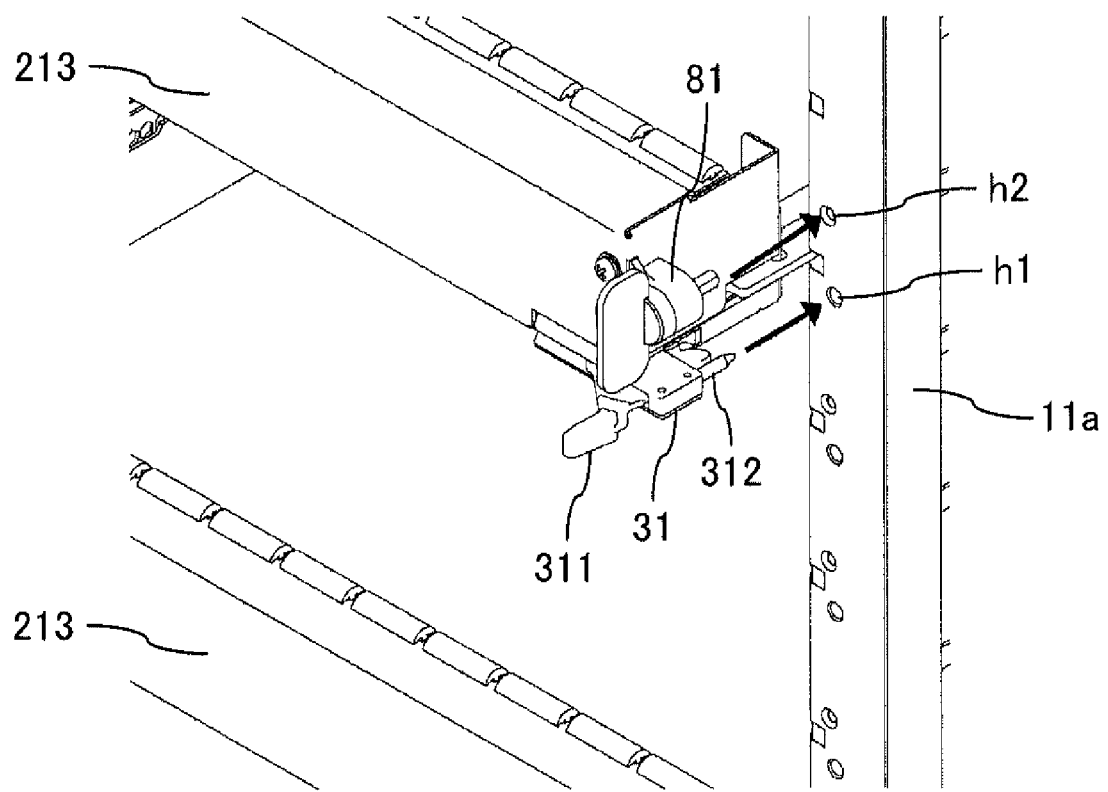
FIG. 11 is a partially enlarged view of an electronic device illustrating an insertional buffering structure with an insertion control function according to a third embodiment.

FIG. 11 illustrates a configuration of an electronic device 1 to which an insertional buffering structure according to a third embodiment is applied. Elements and parts corresponding to those in the structure of the first embodiment are denoted by the same reference symbols as in FIG. 1.

In the third embodiment, a "control device" instead of the "buffering device" suppresses the impact at the time of insertion of the line card 21, and a rotational friction damper (hereinafter referred to as a "key damper") 81 is used as an example of the "control device". FIG. 11 only illustrates the key damper 81 provided on the right side in the insertion direction of the line card 21. However, the key damper 81 can be provided on both the left and right sides, or on either one side of the front panel 213.

Figure 12:
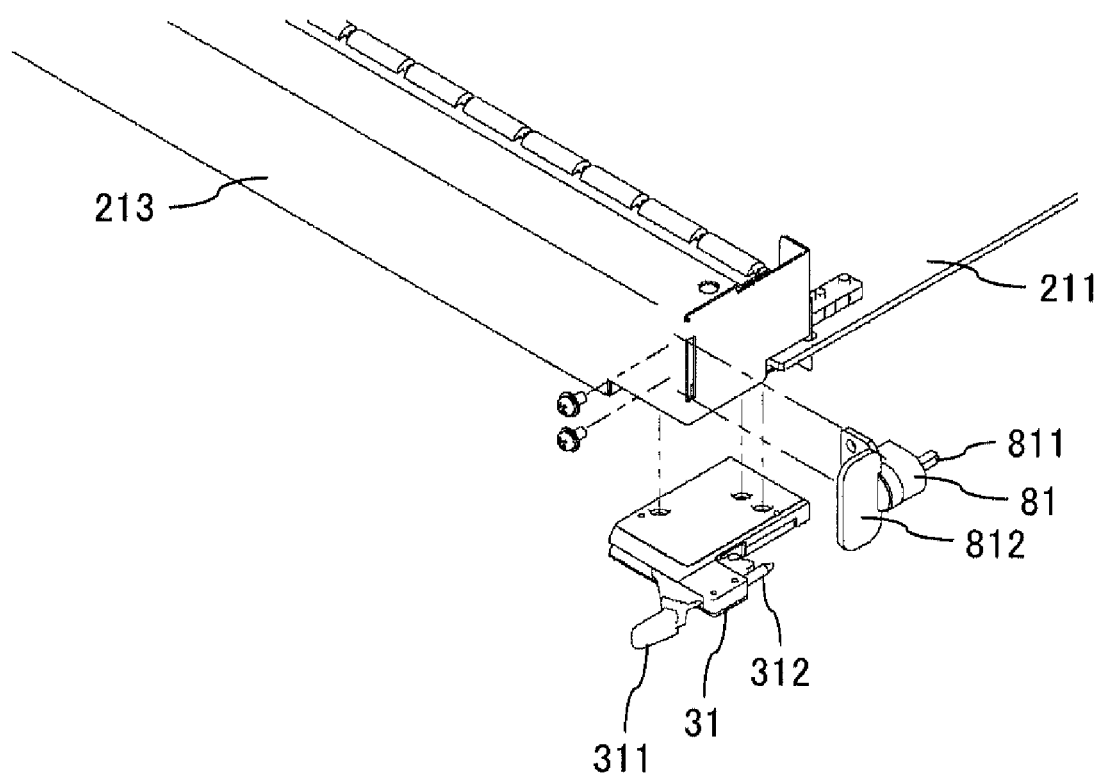
FIG. 12 is an exploded view of a rotational friction damper according to the third embodiment.
Figure 13:
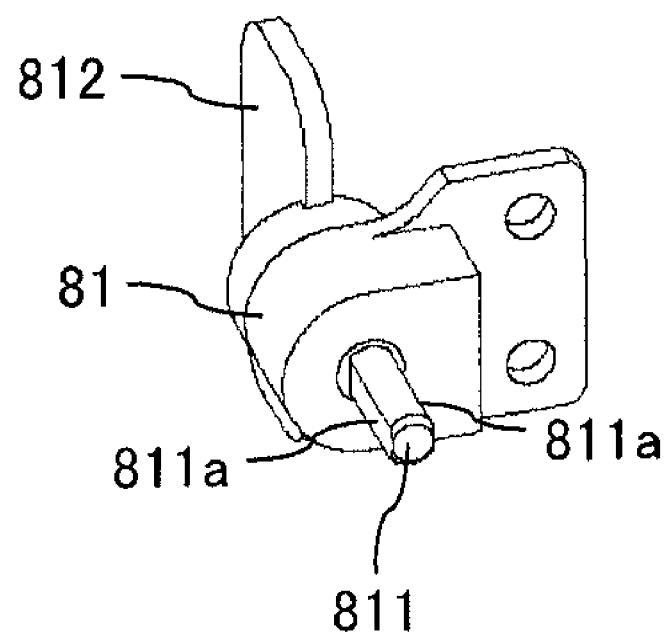
FIG. 13 is an overall diagram of the rotational friction damper.

FIG. 12 illustrates a mounting structure of the key damper 81 with respect to the front panel 213 of the line card 21, and FIG. 13 illustrates an overall configuration of the key damper 81. As depicted in FIG. 13, the key damper 81 includes a pin-shaped key 811 and a control plate 812 for rotating the pin-shaped key 811, and the pin-shaped key 811 includes key faces 811a formed at axially opposite positions. The key damper 81 is fixed by screwing to the front surface of the front panel 213 (FIG. 12). On the front surface of the front frame 11a, a key hole h2 is provided at a position corresponding to the pin-shaped key 811 (FIG. 11), and the key hole h2 has a rotationally symmetric shape with respect to a cross-sectional shape of the pin-shaped key 811. Accordingly, at the time of insertion of the line card 21, the pin-shaped key 811 abuts against the peripheral edge of the key hole h2 due to mismatch of the key surface 811a before the operation start position of the card lever 31, to obstruct progress of the line card 21 ahead from the operation start position. Then when the operator operates the control plate 812 to rotate the pin-shaped key 811, the key faces of the pin-shaped key 811 and the key hole h2 match with each other, and progress ahead from the operation start position can be allowed. The operator causes the line card 21 to move forward up to the operation start position in a state with the key faces matched with each other, and operates the lever arm 311 according to the same method described above, thereby enabling to finish insertion of the line card 21.

In this manner, according to the third embodiment, because a control release operation of the key damper 81 is required before the line card 21 reaches the operation start position of the card lever 311, accelerated insertion itself for forcibly pushing the line card 21 can be avoided. Even if accelerated insertion is performed, because the pin-shaped key 811 abuts against the front surface of the front frame 11a, progress of the line card 21 can be stopped. Here there is concern that impact of the line card 21 is distributed to the front frame 11a, and the impact is transmitted to the bus connector 212 and the back plane board 111 via the printed board 211 or the frame of the shelf 11. However, because the pin-shaped key 811 bumps against the front frame 11a at a remote position from the bus connector 212 and the like, transmission of impact sufficient to cause instantaneous interruption at the connector pin can be avoided.

In the above, an example in which the leaf spring member 41, which is an example of the "buffering device", is provided on the line card 21 side is explained. However, a member such as a leaf spring is not limited to this configuration, and may be provided on the frame side. For example, the leaf spring member formed in a waveform as in the first embodiment is fitted to the front frame 11a, and a bent corner thereof is caused to protrude inward of the frame from an opening provided in the inner lateral side of the front frame 11a. On the other hand, a portion for abutting against the bent corner protruding from the frame side in a process of insertion of the line card 21 is provided in the front panel 213 of the line card 21. In such case, the leaf spring member constitutes a part of the front frame 11a, and an abutting portion provided in the front panel 213 constitutes the "buffering device" of this example.

The present invention can be applied to the electronic devices in general having a plug-in structure between the substrate unit and the backboard, for which hot swapping is required, such as a router and a disk array device as well as a server.

All example and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detailed, it should be understood that the various changes, substitutions, and alterations could be made hereto without departing from the spirit and scope of the invention.

What is claimed is:

1. A substrate unit to be inserted and installed in a substrate housing shelf of an electronic device, comprising:
  a printed board;
  a connector wiring connected to the printed board;
  a front panel provided on the printed board on a front face side of the shelf;
  a lever assisted insertion device including a lever member that engages with a front frame of the shelf before a fully inserted position at which the connector is connected to a connector on the shelf side, to form a leverage fulcrum on the front frame, in which the lever member is constituted such that a force that an operator applies to the lever member is transmitted to the front panel via a point of application with respect to the fulcrum, thereby inserting the substrate unit up to the fully inserted position, and
  a buffering device that abuts against the front frame of the shelf within a depth range of the front panel before an operation start position at which the lever member of the lever assisted insertion device engages with the front frame of the shelf, to absorb impact of the substrate unit at the time of insertion.

2. The substrate unit according to claim 1, wherein
the buffering device comprises a conductive elastic body supported displaceably inward with respect to a lateral side of the front panel, and
at least a part of the elastic body is positioned outside of the lateral side of the front panel at the time of insertion of the substrate unit and abuts against the front frame of the shelf.

3. The substrate unit according to claim 2, wherein
the elastic body is a leaf spring member cantileverly supported displaceably inward with respect to the lateral side of the front panel, and
the leaf spring member forms a waveform within a plane vertical to the front frame of the shelf, and at least one bent corner of the waveform is positioned outside of the lateral side of the front panel at the time of insertion of the substrate unit.

4. The substrate unit according to claim 2, further comprising a latch pin that restricts displacement of the elastic body towards an inside of the front panel.

5. The substrate unit according to claim 3, further comprising a latch pin that restricts displacement of the leaf spring member towards an inside of the front panel.

6. The substrate unit according to claim 1, wherein
the buffering device includes a damper unit, and
the damper unit includes a movable rod extending in an insertion direction of the substrate unit, and the movable rod is positioned outside of the lateral side of the front panel at the time of insertion of the substrate unit to abut against the front frame of the shelf and also functions as an alignment device of the substrate unit.

7. A substrate unit to be inserted and installed in a substrate housing shelf of an electronic device, comprising:
a printed board;
a connector wiring connected to the printed board;
a front panel provided on the printed board on a front face side of the shelf;
a lever assisted insertion device including a lever member that engages with a front frame of the shelf before a fully inserted position at which the connector is connected to a connector on the shelf side, to form a leverage fulcrum on the front frame, in which the lever member is constituted such that a force that an operator applies to the lever member is transmitted to the front panel via a point of application with respect to the fulcrum, thereby inserting the substrate unit up to the fully inserted position, and
a control device that changes over a first operating state in which the control device abuts against the front frame of the shelf before an operation start position at which the lever member of the lever assisted insertion device engages with the front frame of the shelf, to obstruct progress of the substrate unit ahead from the operation start position, and a second operating state in which progress ahead from the operation start position is allowed, depending on a predetermined control release operation performed by the operator.

8. The substrate unit according to claim 7, wherein
the control device includes a key configured so that a direction of a key face is changed according to the predetermined control release operation, the key corresponding to a key hole formed in the front frame of the shelf, and
the key abuts against a peripheral edge of the key hole to obstruct progress of the substrate unit in the first operating state, while in the second operating state, matches with the key hole to allow progress of the substrate unit.

* * * * *